(12) United States Patent
Lissotschenko et al.

(10) Patent No.: US 7,810,938 B2
(45) Date of Patent: Oct. 12, 2010

(54) LASER CONFIGURATION

(75) Inventors: Vitalij Lissotschenko, Fröndenberg (DE); Aleksei Mikhailov, Dortmund (DE)

(73) Assignee: Limo Patentverwaltung GmbH & Co. KG, Gerstengrund (DE)

( * ) Notice: Subject to any disclaimer, the term of this patent is extended or adjusted under 35 U.S.C. 154(b) by 649 days.

(21) Appl. No.: 11/784,295

(22) Filed: Apr. 6, 2007

(65) Prior Publication Data

US 2007/0215583 A1    Sep. 20, 2007

Related U.S. Application Data

(63) Continuation of application No. PCT/EP2004/013494, filed on Nov. 27, 2004, and a continuation of application No. PCT/EP2005/010588, filed on Sep. 30, 2005.

(30) Foreign Application Priority Data

Oct. 6, 2004    (DE) .................. 10 2004 048 917
Feb. 4, 2005    (DE) .................. 10 2005 005 453

(51) Int. Cl.
   *G02B 5/08*    (2006.01)
(52) U.S. Cl. .................................................. 359/850
(58) Field of Classification Search ............... 359/850, 359/855
   See application file for complete search history.

(56) References Cited

U.S. PATENT DOCUMENTS

| 3,865,114 | A |   | 2/1975 | Sharon |
| 3,972,599 | A |   | 8/1976 | Engel et al. |
| 4,250,372 | A |   | 2/1981 | Tani |
| 4,652,722 | A |   | 3/1987 | Stone et al. |
| 4,681,394 | A |   | 7/1987 | Noguchi |
| 4,826,269 | A |   | 5/1989 | Streifer et al. |
| 6,504,650 | B1 | * | 1/2003 | Alfrey ..................... 359/850 |
| 6,888,853 | B1 |   | 5/2005 | Jürgensen |
| 6,934,014 | B1 |   | 8/2005 | Kleinhuber |
| 2006/0098700 | A1 |   | 5/2006 | Alahautala et al. |

FOREIGN PATENT DOCUMENTS

| DE | 198 40 926 A1 | 5/2000 |
| DE | 100 62 453 A1 | 7/2002 |
| GB | 2 038 220 A | 7/1980 |
| JP | 8-75947 | 3/1996 |
| JP | 10-249568 | 9/1998 |
| WO | WO 00/13839 | 3/2000 |
| WO | WO 01/26859 A1 | 4/2001 |
| WO | WO 03/098758 A1 | 11/2003 |

* cited by examiner

*Primary Examiner*—Euncha P Cherry
(74) *Attorney, Agent, or Firm*—Laurence A Greenberg; Werner H Stemer; Ralph E Locher

(57) ABSTRACT

A laser configuration for machining a workpiece includes a plurality of laser light sources for introducing a laser radiation into a predeterminable working area. Some or all of the laser light sources are disposed on an arc of a circle.

13 Claims, 6 Drawing Sheets

LASER CONFIGURATION

CROSS-REFERENCE TO RELATED APPLICATIONS

This is a continuation, under 35 U.S.C. §120, of copending International Application Nos. PCT/EP2004/013494, filed Nov. 27, 2004, and PCT/EP2005/010588, filed Sep. 30, 2005, which designated the United States; this application also claims the priority, under 35 U.S.C. §119, of German Patent Application Nos. DE 10 2004 048 917.3, filed Oct. 6, 2004, and DE 10 2005 005 453.6, filed Feb. 4, 2005; the prior applications are herewith incorporated by reference in their entirety.

BACKGROUND OF THE INVENTION

Field of the Invention

The present invention relates to a laser configuration for machining or working a workpiece. The laser configuration includes a plurality of laser light sources for introducing a laser radiation into a predeterminable working area.

The plurality of laser light sources mentioned in the configuration referred to above can be realized not only by a plurality of lasers but also by laser radiation emanating from a laser that is split into a number of partial beams. For example, those partial beams may then be fed into different optical fibers.

It is known to machine workpieces with a laser beam. The laser beam forms a working area on the workpiece that is defined by a specific energy input. It is also known to place a number of laser light sources in a row and to direct their laser beams together onto a workpiece. In that case, with parallel alignment of the laser beams, a working area formed by the overlapping laser beams is obtained.

As a result of the spreading and overlapping of the laser beams (indicated in FIG. 1), there are marginal regions of the linear working area that have a lower energy density, since they are only reached by one laser light source, and inner regions of higher energy density, since they are reached by two or more laser light sources.

Machining a workpiece, however, requires for example a working area that has a minimum, predetermined energy irradiation and a predetermined spatial extent. Accordingly, a corresponding number of laser light sources must be disposed in the manner described above to meet the requirements with regard to energy irradiation and extent, whereas the marginal regions, which for example can only be reached by one laser light source, remain unused, since the energy input is too low there.

A further disadvantage of known configurations is the fact that the light from a multiplicity of laser light sources cannot be introduced into the linear working area, or only with very great effort.

SUMMARY OF THE INVENTION

It is accordingly an object of the invention to provide a laser configuration, which overcomes the hereinafore-mentioned disadvantages of the heretofore-known devices of this general type and which has greater efficiency and/or can bring together light of a multiplicity of laser light sources in a working plane.

With the foregoing and other objects in view there is provided, in accordance with the invention, a laser configuration for machining a workpiece. The laser configuration comprises a plurality of laser light sources for introducing a laser radiation into a predeterminable working area. Some or all of the laser light sources are disposed on an arc of a circle.

As a result, given an appropriately large radius of the arc, it is possible to provide very many laser light sources, in particular any desired number of them. The light of the laser light sources is brought together in the working plane, for example in a linear working area.

In accordance with another feature of the invention, in this case, the laser radiation emanating from the laser light sources disposed on the arc is at least partially focused into a focal area that is, in particular, substantially puntiform.

In accordance with a further feature of the invention, the arc is disposed around a center point, which corresponds substantially to the focal area which in particular is punctiform.

In accordance with an added feature of the invention, there is provided at least one reflection element, which is suitable for deflecting part of the laser radiation into the working area. Accordingly, the otherwise unusable laser radiation can be diverted into the working area, whereby the efficiency is increased. The deflection also allows a more homogeneous energy distribution over the working area to be achieved, since regions with lower energy density can be additionally illuminated on a targeted basis.

With the objects of the invention in view, there is also provided a laser configuration for machining a workpiece. The laser configuration comprises a plurality of laser light sources for introducing a laser radiation into a predeterminable working area. At least one reflection element is provided for deflecting part of the laser radiation into the working area.

In accordance with an additional feature of the invention, a plurality of laser light sources are disposed in at least one row and the laser light sources can form a linear working area. The at least one reflection element is suitable for reflecting the laser radiation emanating from the outer laser light sources into the working area. Such a configuration of the laser light sources and the at least one reflection element make it possible to make the otherwise unused energy of the laser light sources disposed in the marginal region usable for the predetermined working area, so that a greater efficiency of the overall laser configuration can be achieved.

In accordance with yet another feature of the invention, the at least one reflection element has a two-dimensional configuration, and the row of laser light sources is aligned approximately orthogonal to the at least one reflection element. Such a structure and configuration of the reflection element and the laser light sources allows particularly good results to be achieved. In particular, such a laser configuration is suitable for use in industrial production.

In accordance with yet a further feature of the invention, there is provided a first reflection element and a second reflection element, and the reflection elements extend approximately between the laser light sources and the workpiece. This configuration is also suitable in a particularly advantageous way for industrial use.

In accordance with yet an added feature of the invention, in order to improve the homogeneity of the energy distribution in the working area, a lens device which is suitable for the collimation or focusing of the laser beams emitted by the laser light sources with regard to one direction, in particular with regard to a direction perpendicular to the average direction of propagation of the laser beams, is disposed between the laser light sources and the workpiece. The fact that the laser beams are only collimated or focused with regard to one transverse direction, but not in the transverse direction perpendicular thereto, makes it possible to create laser light cones that are preferably strongly elliptical and largely overlapping and that complement one another to form the desired linear working area.

In accordance with yet an additional feature of the invention, the lens device includes at least one cylindrical lens. It may also be provided that the lens device includes a plurality of cylindrical lenses, which preferably form with one another an included angle unequal to 0° and unequal to 180°, in particular an angle between 140° and 160°.

In accordance with still another feature of the invention, in order to introduce greater luminous power into the working area, the laser light sources are disposed in parallel rows.

In accordance with still a further feature of the invention, the distance between the lens device and the workpiece is approximately 50 cm. This allows working areas with particularly homogeneous energy density to be configured.

In accordance with still an added feature of the invention, the laser light source includes a semiconductor laser or an optical fiber which is preferably fed by at least one semiconductor laser.

In accordance with still an additional feature of the invention, in order to protect the laser configuration, a laser-light-transmitting plate is provided between the lens device and the workpiece.

In accordance with again another feature of the invention, the laser radiation impinges on the cylindrical lens or the plurality of cylindrical lenses downstream of the focal area into which the laser radiation emanating from the laser light sources disposed on the arc is focused.

In accordance with again a further feature of the invention, a further lens, in particular a further cylindrical lens, is provided between the focal area and the cylindrical lens or the plurality of cylindrical lenses.

In accordance with a concomitant feature of the invention, imaging optics for imaging the laser radiation onto the workpiece are provided downstream of the reflection elements in the direction of propagation of the laser radiation. Such a measure allows a comparatively great distance to be chosen between the working area and the reflection elements, which are sometimes very large, and consequently unwieldy.

Other features which are considered as characteristic for the invention are set forth in the appended claims.

Although the invention is illustrated and described herein as embodied in a laser configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
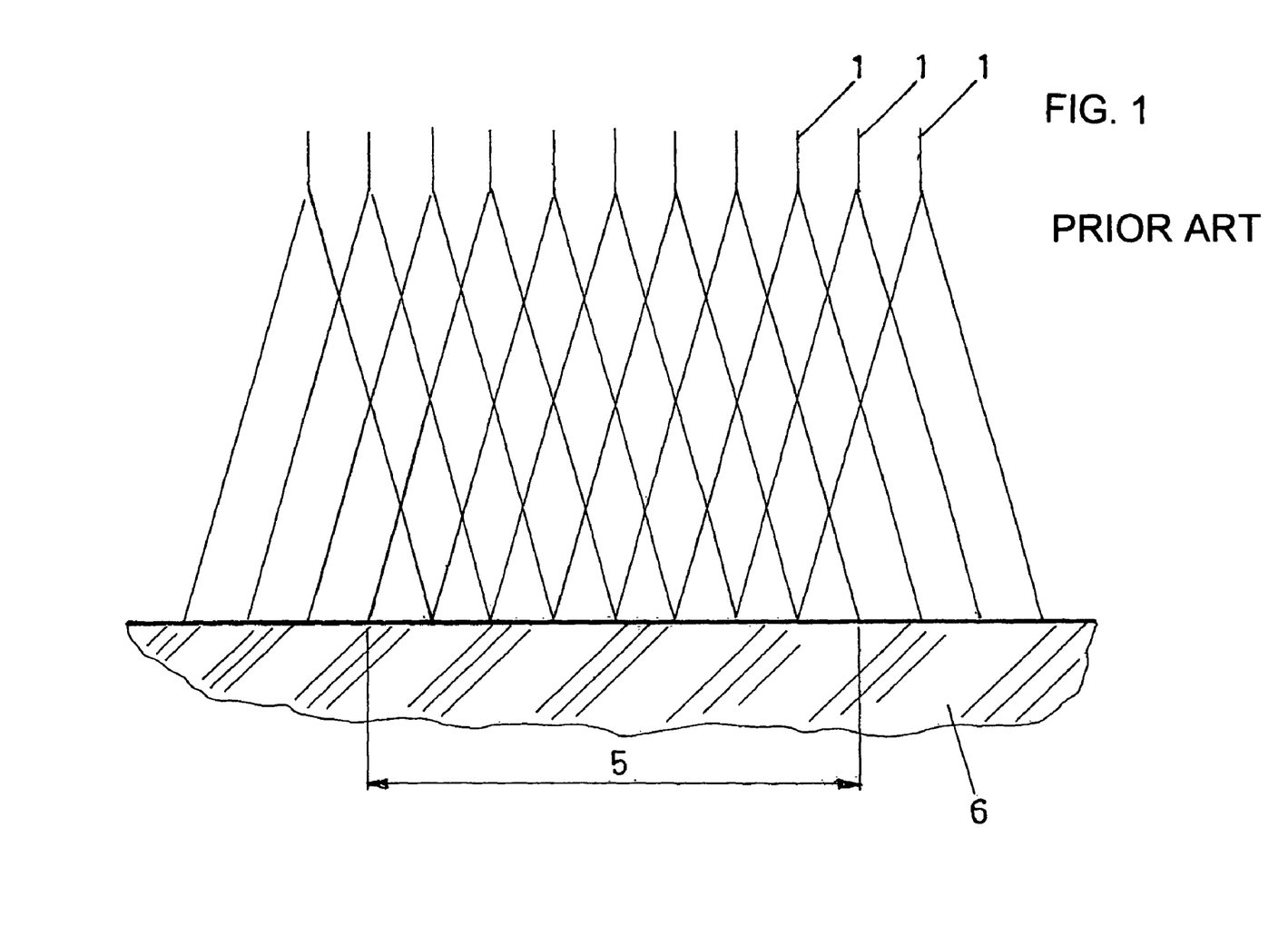
FIG. 1 is a fragmentary, diagrammatic, plan view of a laser configuration according to the prior art.

Referring now to the figures of the drawings in detail and first, particularly, to FIG. 1 thereof, there is seen a laser configuration according to the prior art. A plurality of laser light sources 1 are respectively disposed in a row and an emergence of their laser light is directed in the direction of a workpiece 6. That configuration has the effect of creating on the workpiece a linear working area 5, which is distinguished by different energy densities, or at least by low energy densities in marginal regions, because of respective overlaps of laser beam cones as indicated.

Figure 2:
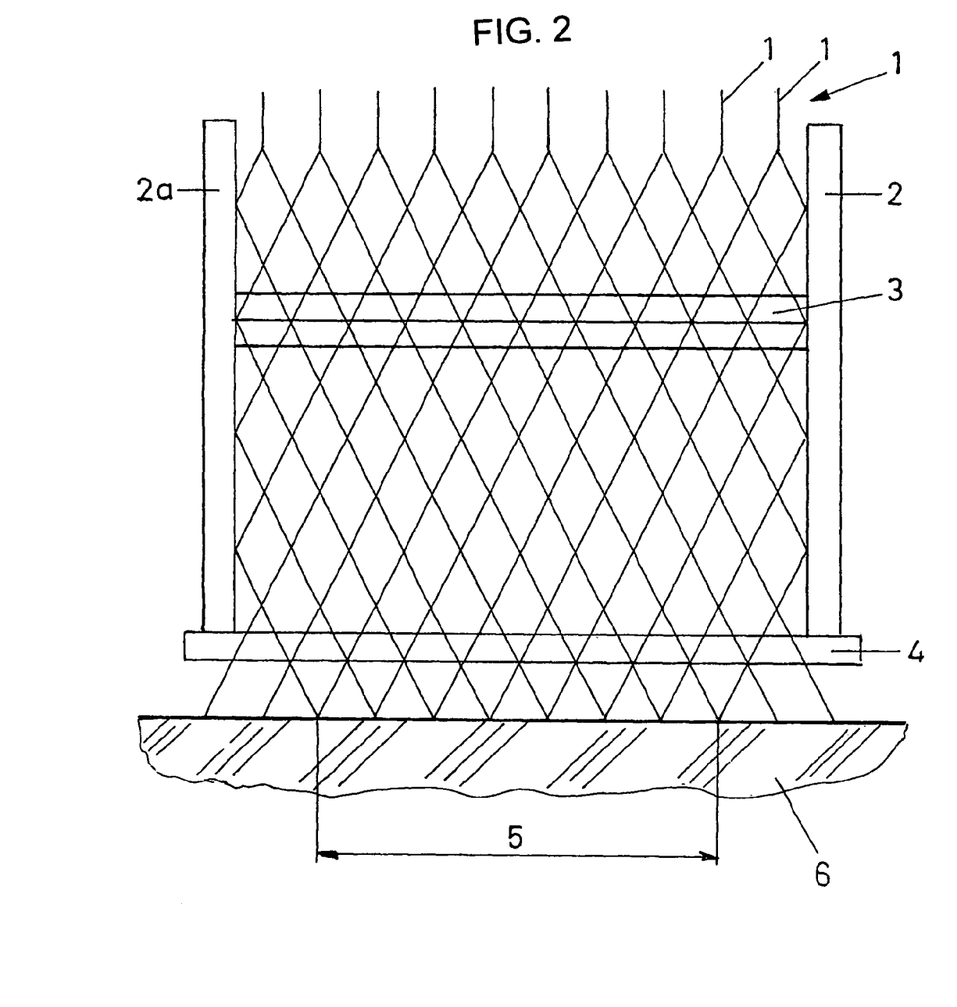
FIG. 2 is a fragmentary, plan view of a laser configuration according to the invention.
Figure 3:
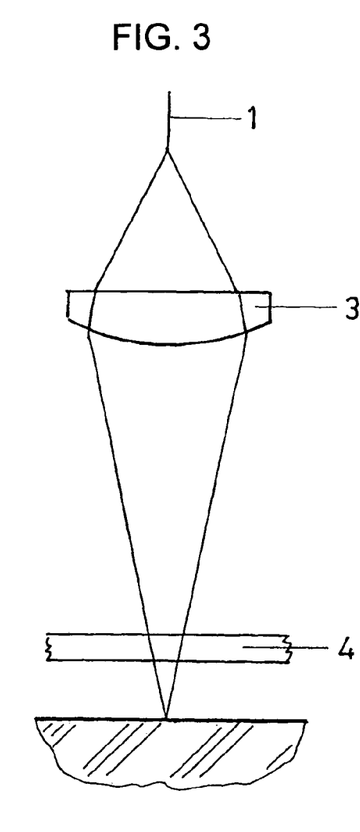
FIG. 3 is a fragmentary, side-elevational view of a laser configuration according to the invention.

In FIG. 2 and FIG. 3, a laser configuration according to the invention is represented. The laser configuration according to the invention is distinguished firstly by the fact that two two-dimensional reflection elements 2, 2a, in particular two-dimensional mirrors, are provided at least partly to the sides of the laser light sources 1 and the workpiece 6. The reflection elements 2, 2a are suitable for reflecting part of the laser light into a predeterminable working area 5. This allows the laser light of the laser light sources 1 provided at the margins to likewise be made usable for the predetermined working area 5.

This produces better utilization of the laser light provided by the laser light sources 1, since the originally unusable part can be reflected into the predetermined working area. Accordingly, the efficiency of a laser configuration configured according to the invention is increased, or fewer laser light sources 1 are required to illuminate a working area 5 that is the same in comparison with the prior art with the same predeterminable energy.

A further advantageous effect of the configuration of the reflection elements 2, 2a in the proposed way is that the homogeneity of the energy distribution over the working area 5 can be improved. On the basis of overlapping laser light cones, as indicated for example in FIG. 1, regions of high energy irradiation are obtained alongside regions of low or extremely low energy irradiation. One of the factors on which the degree of energy irradiation is dependent is how many laser light sources 1 illuminate a specific portion of the working area 5. By appropriate reflection or deflection of the laser beams, regions with low or extremely low laser light irradiation can be additionally illuminated on a targeted basis, so that a largely homogeneous energy distribution along the working area can be ensured.

Figure 7:
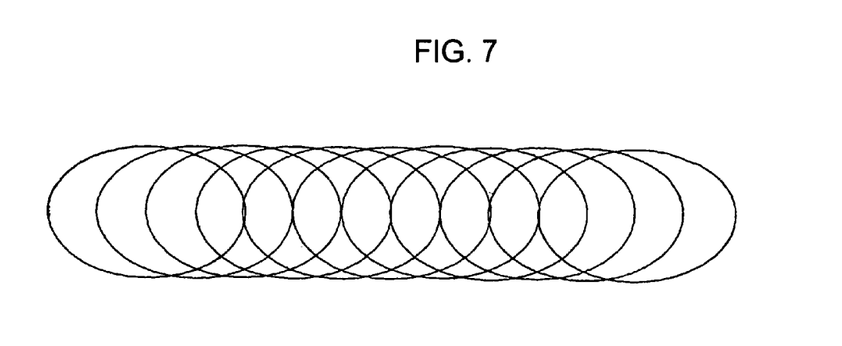
FIG. 7 is a purely diagrammatic and not actually proportioned representation used to illustrate a formation of a linear working area by overlapping incident laser light cones after they have passed through a lens device.

Furthermore, it is provided that at least one cylindrical lens 3 is disposed between the laser light sources 1 and the workpiece 6 or working area 5. The cylindrical lens 3 likewise contributes to making the energy distribution along the working area 5 homogeneous and to forming the working area 5 in an advantageous way. On the basis of a substantially circular shape of the respectively impinging laser light cone, without the cylindrical lens 3, a sequence of overlapping circular laser light cones is obtained, forming the working area 5. If, as proposed, a cylindrical lens 3 is then inserted into the path of rays, the originally diverging laser beam is collimated or focused in one direction, but not influenced in the direction perpendicular thereto, so that the working area 5 is then distinguished by a sequence of strongly elliptically formed impinging light cones (as represented purely by way of example and diagrammatically in FIG. 7). Accordingly, extensive overlapping regions are obtained, resulting in an almost homogeneous energy distribution over the working area 5.

Particularly good results are obtained with a distance of approximately 50 cm between the cylindrical lens and the workpiece 6.

A plate 4 that allows laser light to be transmitted is also advantageously provided between the reflection elements 2, 2a and the workpiece 6.

It is also advantageously provided that the laser light sources include 1 μm optical fibers, which are correspondingly subjected to a suitable laser. It goes without saying that it may also be envisaged to provide the lasers directly at the indicated irradiating positions (laser light source 1), but this causes unnecessary restrictions on the distance between the laser light sources 1, which should preferably be 1 cm. By contrast with laser beams emanating directly from the laser, which have for example a primarily square cross section, the use of optical fibers also has the effect that approximately circular laser beams are obtained.

A laser beam with a circular cross section or with an elliptical cross section (after the cylindrical lens 3), however, produces smoother transitional regions with regard to energy distribution than would be the case for example with laser beams with a rectangular cross section (after the cylindrical lens 3).

At present, laser light sources 1 with a luminous power output of approximately 100 W are used. It is provided that approximately 100 laser light sources 1 are combined in a laser light configuration, so that a luminous power of approximately 10 kW is obtained in the working area 5. However, luminous power levels of 1 megawatt are conceivable, and can preferably be achieved by individual laser light sources 1 of approximately 400 watts and a configuration of the laser light sources 1 and the cylindrical lens 3 as diagrammatically represented in FIG. 6.

Figure 4:
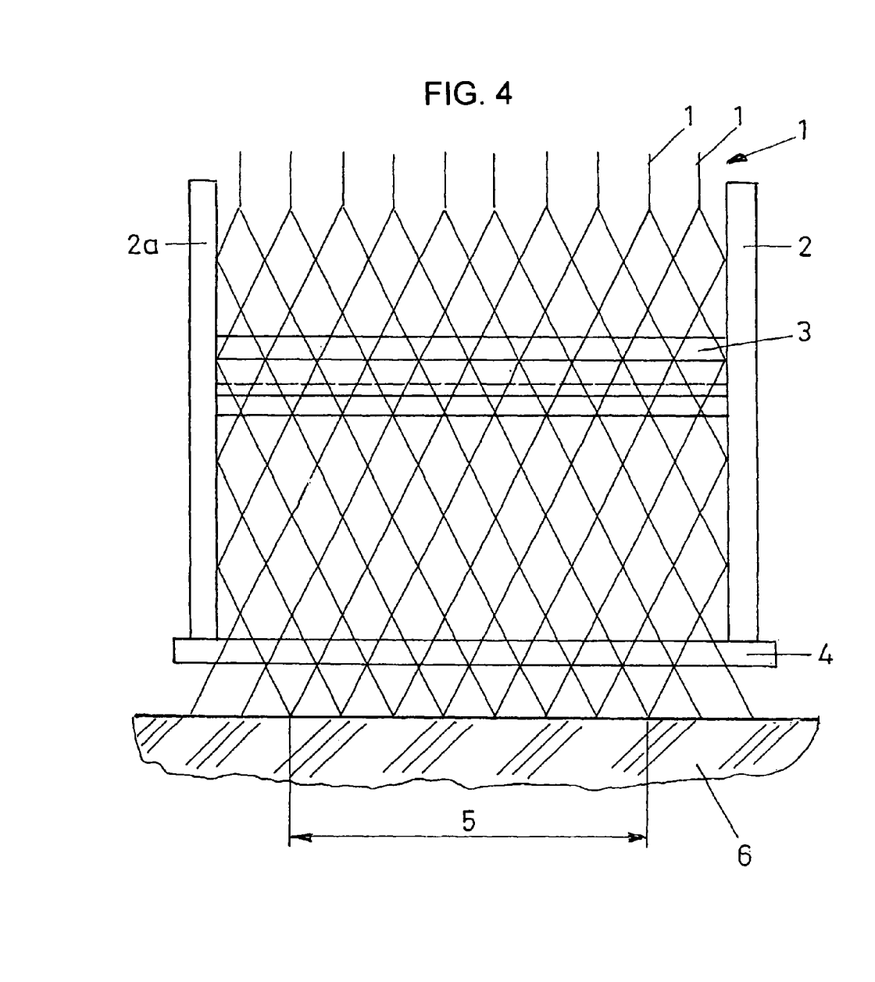
FIG. 4 is a fragmentary, plan view of a further embodiment of a laser configuration according to the invention.
Figure 5:
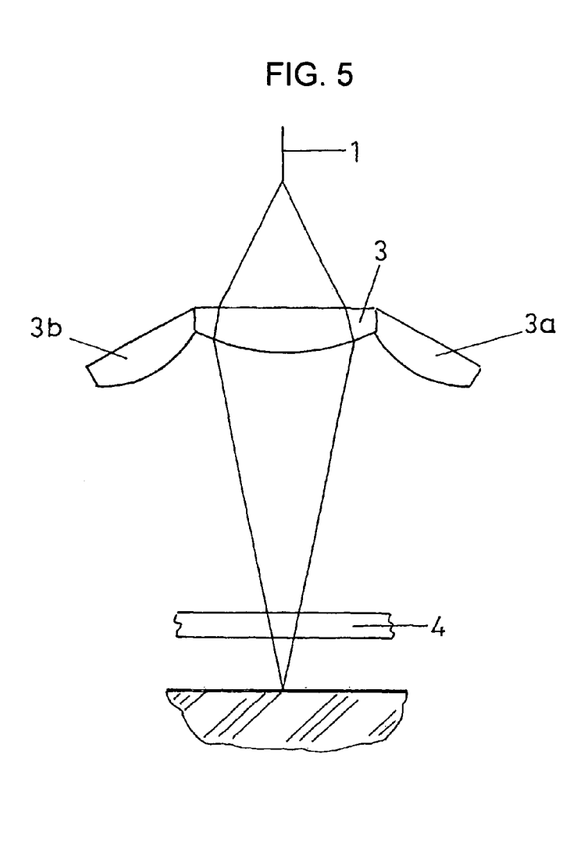
FIG. 5 is a fragmentary, side-elevational view of the embodiment of the laser configuration according to the invention shown in FIG. 4.
Figure 6:
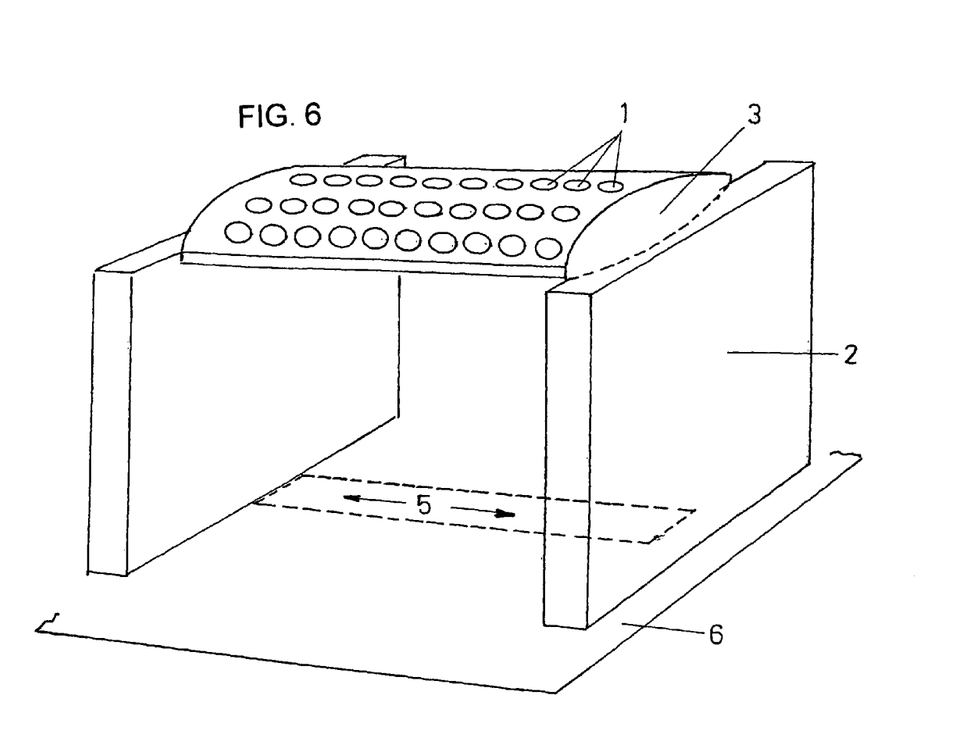
FIG. 6 is a perspective view of an embodiment according to FIG. 4 with a reflection element.

In this case, the cylindrical lens 3 is disposed like a dome above the workpiece 6 or the working area 5 as shown in FIG. 6. The indicated circles respectively represent irradiating points for the laser light sources 1. The configuration or alignment of the laser light sources 1 and the cylindrical lens 3 is respectively chosen such that the laser beams form the linear working area 5, which is optimized or homogenized in the way proposed above. Alternatively, a configuration of a number of cylindrical lenses 3, 3a, 3b may also be provided as shown in FIGS. 4 and 5.

Altogether, a laser configuration according to the prior art can be significantly improved by the measures proposed herein, both with regard to the homogenization of the energy distribution in the working area 5 and in the efficiency of the energy irradiation into the working area 5. As already indicated, the number of laser light sources 1 can also be reduced while the luminous power in the working area remains the same, since the laser light is used much more effectively, in that the laser light of the outer laser light sources 1 is also deflected into the working area. Conversely, a much higher level of luminous power can be introduced into the working area with the same number of laser light sources 1, whereby such high power levels of 1 megawatt are possible in the working area 5 in an efficient way.

Such a laser configuration also offers a high degree of fail safety. In the event of a laser light source failing, this only results in a power loss of 0.01%, whereas the failure of a laser light source in a configuration according to the prior art already means a power loss of 1%.

A laser configuration as proposed herein may be intended, for example, for drying a workpiece path or for melting workpiece surfaces. It may accordingly also be provided that the workpiece 6 and the laser configuration are respectively moved in relation to each other.

Figure 8:
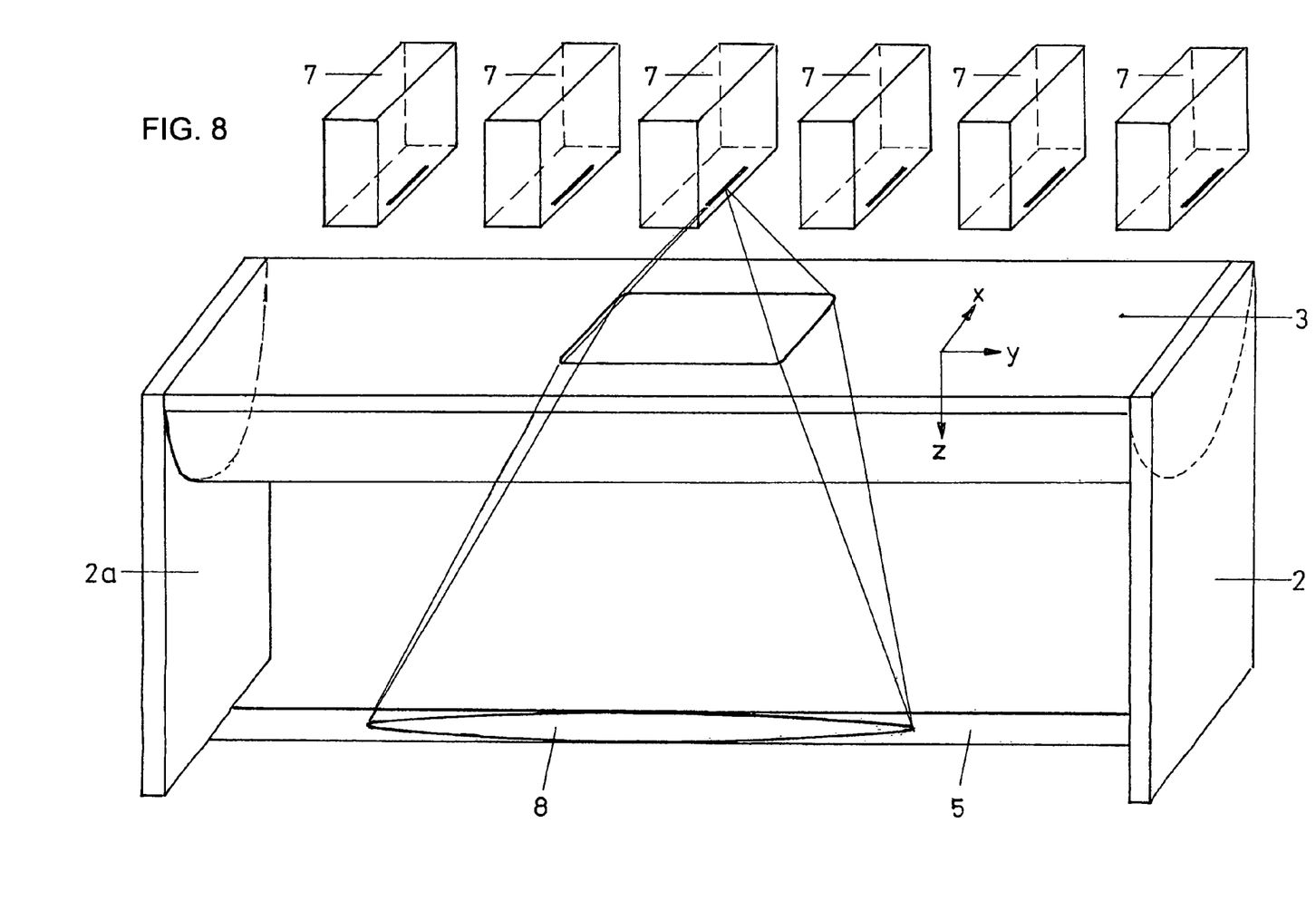
FIG. 8 is a perspective view of a further embodiment of a laser configuration according to the invention.

FIG. 8 shows a configuration according to the invention in which laser diode bars are provided as laser light sources 7. These are disposed in such a way that they are spaced apart next to one another in the direction of their fast axis (y in FIG. 8), i.e. in the direction perpendicular to the layer structure of the semiconductor laser.

The slow axis direction (x in FIG. 8) of the laser radiation is collimated by the cylindrical lens 3, whereas the fast axis direction is made to diverge further as the laser radiation propagates in the z direction (see FIG. 8), so that in the linear working area 5 a region 8 that is relatively extensive in the y direction is illuminated by each laser light source 7.

Figure 9:
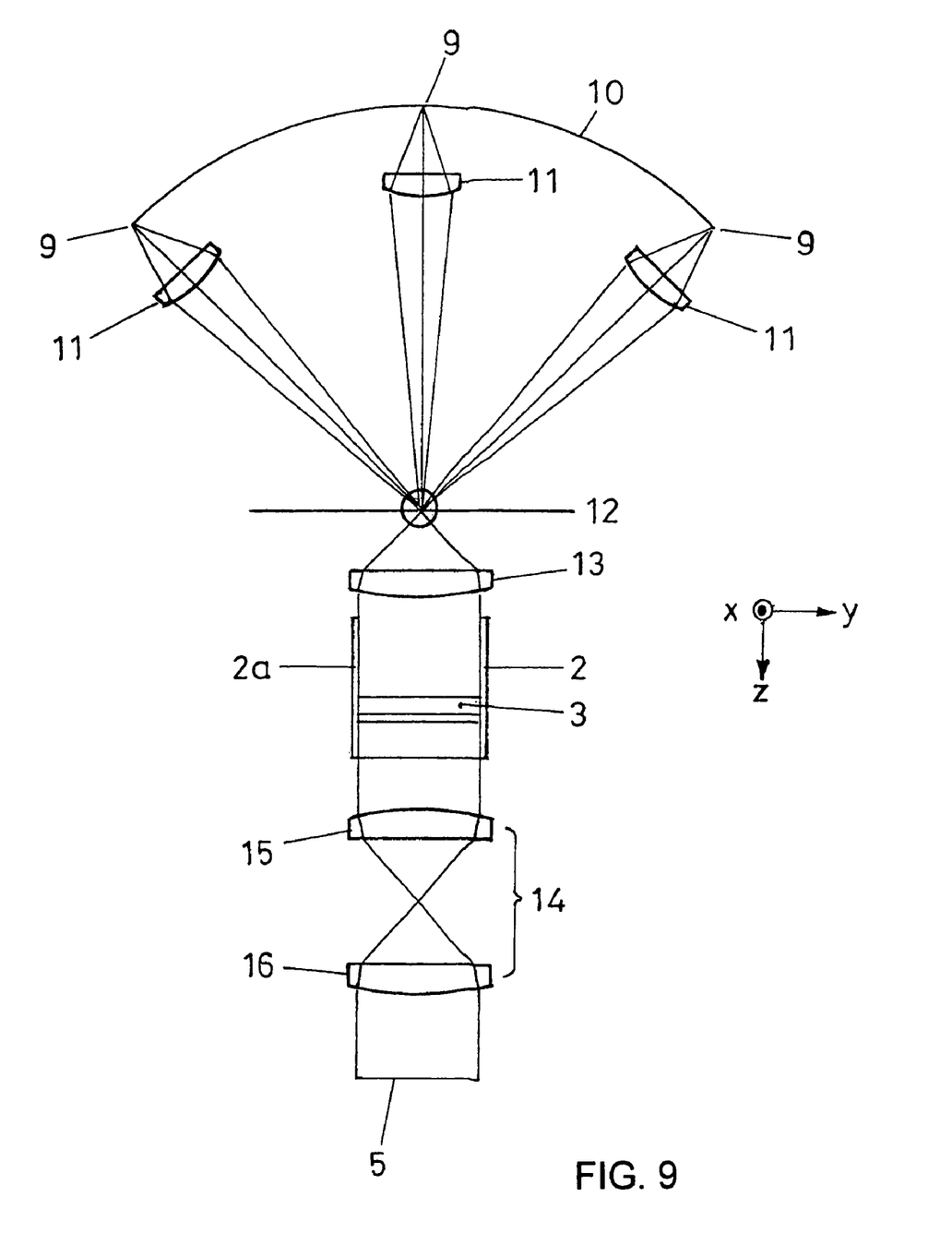
FIG. 9 is a diagrammatic, side-elevational view of a further embodiment of a laser configuration according to the invention.

FIG. 9 shows an embodiment of a configuration according to the invention in which laser light sources 9 formed as fiber ends or laser diode bars or the like are disposed on an arc 10 of a circle. Each of the laser light sources 9 is assigned a focusing device 11, which focus the laser radiation emanating from the individual laser light sources 9 into a common focal area, in particular an approximately puntiform focal area. A center point 12 of the arc 10 is disposed in the common focal area in this case. The more laser light sources 9 that are to be used, the larger the arc 10 must be, which can be achieved by increasing the radius of the arc.

A cylindrical lens 13 is disposed downstream of the common focal area, or downstream of the center point 12 of the arc 10, in the average direction of propagation z (see FIG. 9) of the laser radiation. The cylindrical lens 13 largely collimates the laser radiation emanating from the individual laser light sources 9 with regard to the y direction (see FIG. 9), so that between the two reflection elements 2, 2a the laser radiation can propagate in the z direction. In this case, the cylinder axis of the cylindrical lens 13 extends in the x direction. The cylinder axis of the cylindrical lens 3 extends in the y direction.

Instead of the workpiece 6 being disposed in the direct vicinity of the reflection elements 2, 2a, in the case of the configuration depicted in FIG. 9, the workpiece or the linear working area 5 is further away from the reflection elements 2, 2a. This is achieved by insertion of imaging optics 14. These imaging optics 14 may include cylindrical lenses 15, 16 and bring about 1:1 or 1:−1 imaging of the laser radiation into the working plane.

We claim:

1. A laser configuration for machining a workpiece, the laser configuration comprising:
   a plurality of laser light sources being disposed in at least one row for introducing a laser radiation into a predetermined linear working area, said plurality of laser light sources including outer laser light sources; and
   a first reflection element and a second reflection element each having a two-dimensional configuration;
   said at least one row of laser light sources being aligned approximately orthogonal to said first reflection element and said second reflection element;

said first reflection element and said second reflection element configured to reflect said laser radiation emanating from said outer laser light sources into said working area; and said first reflection element and said second reflection element being aligned opposite each other leaving a space between them so that said laser radiation propagates from said at least one row of laser light sources through said space between said first reflection element and said second reflection element and to said working area.

2. The laser configuration according to claim 1, wherein said first reflection element and said second reflection element extend approximately between said laser light sources and the workpiece.

3. The laser configuration according to claim 1, which further comprises a lens device disposed between said laser light sources and the workpiece for collimation or focusing of laser beams emitted by said laser light sources with regard to one direction.

4. The laser configuration according to claim 3, wherein said one direction is perpendicular to an average direction of propagation of said laser beams.

5. The laser configuration according to claim 3, wherein said lens device includes at least one cylindrical lens.

6. The laser configuration according to claim 3, wherein said lens device includes a plurality of cylindrical lenses forming with one another an included angle unequal to 0° and unequal to 180°.

7. The laser configuration according to claim 6, wherein said included angle is between 140° and 160°.

8. The laser configuration according to claim 3, wherein a distance between said lens device and the workpiece is approximately 50 cm.

9. The laser configuration according to claim 1, wherein said plurality of laser light sources includes a semiconductor laser.

10. The laser configuration according to claim 1, wherein said plurality of laser light sources includes an optical fiber fed by at least one semiconductor laser.

11. The laser configuration according to claim 3, which further comprises an at least partially laser-light-transmitting plate disposed between said lens device and the workpiece.

12. The laser configuration according to claim 1, wherein said plurality of laser light sources are disposed in parallel rows.

13. The laser configuration according to claim 1, which further comprises imaging optics disposed downstream of said at least one reflection element in a direction of propagation of said laser radiation, for imaging said laser radiation onto the workpiece.

* * * * *